US006879747B2

(12) United States Patent
Ikegame

(10) Patent No.: US 6,879,747 B2
(45) Date of Patent: Apr. 12, 2005

(54) GALVANOMETER MIRROR AND OPTICAL SWITCHING DEVICE USING THE SAME

(75) Inventor: Tetsuo Ikegame, Hachioji (JP)

(73) Assignee: Olympus Optical Co., Ltd., Tokyo (JP)

( * ) Notice: Subject to any disclaimer, the term of this patent is extended or adjusted under 35 U.S.C. 154(b) by 4 days.

(21) Appl. No.: 10/191,137

(22) Filed: Jul. 9, 2002

(65) Prior Publication Data
US 2002/0171413 A1 Nov. 21, 2002

Related U.S. Application Data

(63) Continuation of application No. PCT/JP01/09970, filed on Nov. 15, 2001.

(30) Foreign Application Priority Data

Nov. 16, 2000 (JP) ........................................ 2000-350115

(51) Int. Cl.$^7$ ................................................. G02B 6/26
(52) U.S. Cl. .............................. 385/18; 385/16; 359/196
(58) Field of Search ................ 385/16–19; 359/196–226

(56) References Cited

U.S. PATENT DOCUMENTS

| 5,959,758 | A | | 9/1999 | Seo | |
|---|---|---|---|---|---|
| 6,388,789 | B1 | * | 5/2002 | Bernstein | .................... 359/198 |
| 6,430,332 | B1 | * | 8/2002 | Laor et al. | .................... 385/18 |
| 6,526,194 | B1 | * | 2/2003 | Laor | .......................... 385/18 |
| 6,556,737 | B1 | * | 4/2003 | Miu et al. | ..................... 385/16 |
| 6,580,846 | B1 | * | 6/2003 | Burroughs et al. | ........... 385/16 |
| 2002/0186918 | A1 | * | 12/2002 | Burroughs | ..................... 385/18 |
| 2004/0013343 | A1 | * | 1/2004 | Hoshikawa et al. | .......... 385/16 |
| 2004/0013350 | A1 | * | 1/2004 | Kiadeh | ........................ 385/18 |

FOREIGN PATENT DOCUMENTS

| JP | 5-12686 A | 1/1993 |
|---|---|---|
| JP | 5-60993 A | 3/1993 |
| JP | 10-160418 A | 6/1998 |
| JP | 10-213766 A | 8/1998 |
| JP | 2000-10029 A | 1/2000 |
| JP | 2000-81588 A | 3/2000 |

* cited by examiner

Primary Examiner—Rodney Bovernick
Assistant Examiner—Sung Pak
(74) Attorney, Agent, or Firm—Frishauf, Holtz, Goodman & Chick, P.C.

(57) ABSTRACT

A mirror is fixed at the front of a mirror holder constituting a moving body. First and second coils are attached on the outer circumferential surface of the mirror holder at both sides of a plane passing through the center of gravity of the moving body and parallel to the surface of the mirror. The moving body is rotatably supported by springs so that a rotation axis and another rotation axis orthogonal thereto pass through the center of gravity. Magnets are fixed to a stationary magnet holder to lie at the right and the left sides of the first coil and the upper and lower sides of the second coil. The centers of torque acting on the first and second coils when driving current is applied to the first and second coils are set in the vicinity of the center of gravity and the supporting point of the springs.

25 Claims, 14 Drawing Sheets

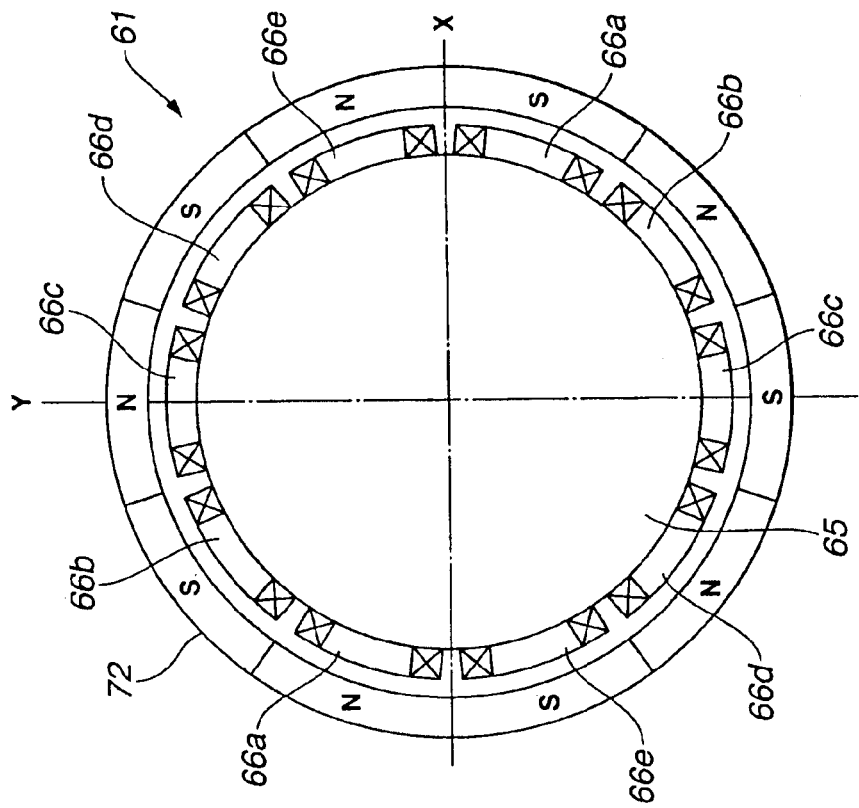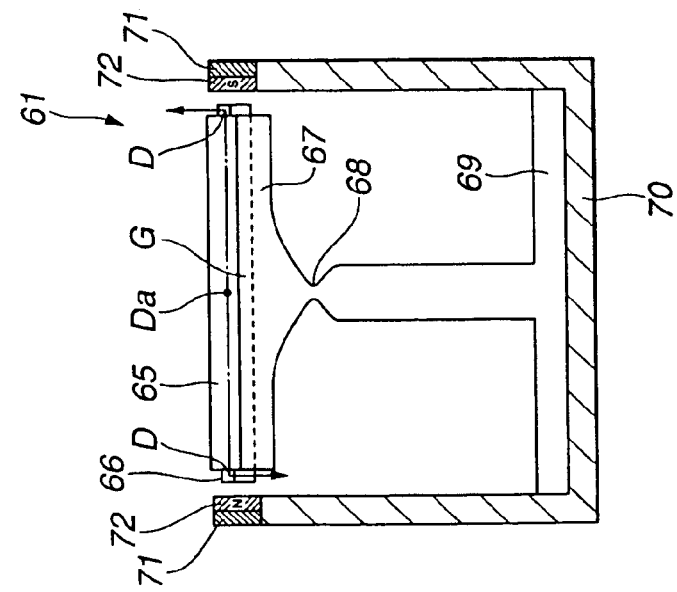
FIG.16B
FIG.16A
Prior Art

GALVANOMETER MIRROR AND OPTICAL SWITCHING DEVICE USING THE SAME

This application is a Continuation Application of International Application PCT/JP01/09970 filed Nov. 15, 2001, the entire contents of which are incorporated herein by reference.

TECHNICAL FIELD

The present invention relates to a galvanometer mirror and an optical switching device using the galvanometer mirror that are used for an information read-write device for reading and/or writing information to and/or from an information medium such as a magnetic optical disk drive, a write-once-read-many optical disk drive, a phase-change optical disk drive, a CD-ROM, a DVD, and an optical card or the like, and also that are used for an optical device such as an optical scanner and an optical deflector for optical communication.

BACKGROUND ART

Optical element driving devices such as a galvanometer mirror using a mirror for diffracting a luminous flux are used in optical devices such as an information read-write device for reading and/or writing information to and/or from an information medium such as an optical disk drive, a write-once-read-many optical disk drive, a phase-change optical disk drive, a CD-ROM, a DVD, an optical card or the like, and also used in other optical devices such as an optical scanner or the like.

As an optical element driving device, an exemplary galvanometer mirror 61 shown in FIGS. 16A and 16B is disclosed in Japanese Unexamined Patent Application Publication No. 5-12686. Note that FIG. 16A illustrates a sectional structure of the galvanometer mirror 61 and FIG. 16B illustrates a partial plan view of the galvanometer mirror 61.

The galvanometer mirror 61 has a round reflecting mirror 65 disposed therein, and a plurality of coils 66a to 66e wound in a rectangular shape that is arranged on the rear surface of the reflecting mirror 65, each in a symmetrical manner with respect to the center of the reflecting mirror 65, and that is fixed to the side surface of the reflecting mirror 65 by bending two short sides of each of the coils 66a to 66e. The reflecting mirror 65 is fixed on the upper surface of a mirror support 67 and is rotatably supported in substantially any given direction by attaching the mirror support 67 to a tubular housing 70 via a hinge 68 and a base 69, wherein the hinge 68 is integrally formed in the middle of the rear surface of the mirror support 67.

Also, the housing 70 has a ring-shaped back yoke 71 disposed thereon so as to face the side surface of the reflecting mirror 65 and has a multipolar magnet 72 on the inner surface of the back yoke 71 disposed thereon such that the poles of the multipolar magnets face the corresponding bent parts of the coils 66a to 66e, wherein the bent parts are fixed to the side surface of the reflecting mirror 65. This arrangement allows the reflecting mirror 65 to rotate around a rotation axis lying in a direction orthogonal to the coil in question by applying electric current to the desired coil so as to generate forces at the two short sides thereof in mutually opposite directions. For example, electric current applied to the coil 66c flows in the two short sides of the coil 66c in mutually opposite X-directions, thereby allowing forces generated by an electromagnetic interaction with the magnetic fields of the multipolar magnet 72 to act on the two short sides in mutually opposite directions perpendicular to the plane of the drawing. In other words, upward and downward forces act on the respective short sides of the coil 66c in the mutually opposite directions perpendicular to the plane of the drawing. As a result, the reflecting mirror 65 rotates around X-axis. Also, concurrently applying electric current to adjacent two coils with desired current ratios allows the reflecting mirror 65 to rotate around any given rotation axis.

A plurality of coils on which a plurality of forces acts is arranged at one side relative to the hinge 68, which is a supporting member and acts as a tilting center, in the direction perpendicular to the reflection surface of the reflecting mirror 65. Although the hinge 68, the mirror support 67, and the base 69 are integrally formed, the hinge 68 acts as the supporting member for tiltably supporting the mirror by changing its shape. The mirror support 67 and the base 69 do not change their shapes when tilting the mirror and have a function as a structural member. The hinge 68 changes its shape when tilting the mirror and acts as a tilting center.

The magnetic fields of the magnet 72 generates upward and downward forces at driving points D indicated in FIG. 16A on the short sides of a coil in the opposite directions parallel to the plane of the drawing, leading to a torque generated around the hinge 68 on the moving body including the mirror 65, thereby tilting the moving body around the hinge 68. The center of torque of the forces generated at the driving points D on both sides lies at Da.

In the galvanometer mirror 61, the mirror 65 is configured so as to be driven and supported in multi-directions such that parts of the coils 66a to 66e for tilting the mirror 65 in multi-directions are disposed so as to be sandwiched between the mirror 65 and the supporting member for supporting the mirror 65, effective sides of the coils generating forces are bent and disposed on the side surface of the mirror 65, the magnet 72 is disposed outside the outer periphery of the coils, and the linear hinge-like support, which has a circular cross-section, of the supporting member is disposed on the rear surface of the mirror 65.

Incidentally, in the known example shown in FIGS. 16A and 16B, the mirror 65, the driving coils 66a to 66e, and the magnet 72 are disposed at one side of the hinge 68 at which the rotation axis of the tilting mirror 65 lies, and which serves as the tilting center and the supporting member.

This arrangement causes a difficulty in that the center of torque Da generated at the driving points D of the coils 66a to 66e lies at the hinge 68. Also, the center of gravity G of the moving body of the known example lies away from the hinge 68 since the mirror 65 and the coils 66a to 66e are disposed at one side of the hinge 68, causing a difficulty in that the supporting member lies at the center of gravity, giving rise to a problem in which resonance takes place when the mirror 65 is driven for tilting, accordingly causing the driving characteristics to deteriorate.

The present invention is made in view of the above problem. An object of the present invention is to provide a galvanometer mirror that can be set such that the center of torque acting on the moving body lies near the center of gravity of the moving body or near the center of the movable support when the mirror is driven for tilting and that has excellent driving characteristics.

DISCLOSURE OF INVENTION

A galvanometer mirror according to the present invention comprises at least: a mirror; a moving body comprising a first coil and a second coil; supporting members for supporting the moving body tiltably around at least a first axis with respect to a stationary member; and magnetic circuits, wherein the first coil and the second coil are disposed at both sides of a plane passing through the center of gravity of the moving body and parallel to the surface of the mirror.

Also, a galvanometer mirror according to the present invention comprises at least: a mirror; a moving body comprising a first coil and a second coil; supporting members for supporting the moving body tiltably around at least a first axis with respect to a stationary member; and magnetic circuits, wherein the first coil and the second coil are disposed at one and the other of the supporting members for the moving body respectively.

Furthermore, a galvanometer mirror according to the present invention comprises at least: a mirror; a moving body comprising a first coil and a second coil; supporting members for supporting the moving body tiltably around at least a first axis with respect to a stationary member; and magnetic circuits, wherein at least a part of the magnetic circuit acting on the first coil and at least a part of the other magnetic circuit are disposed at one and the other of the supporting members respectively.

Still furthermore, a galvanometer mirror according to the present invention comprises at least: a mirror; a moving body comprising a first magnetic member and a second magnetic member; supporting members for supporting the moving body tiltably around at least a first axis with respect to a stationary member; and coils, wherein the first magnetic member and the second magnetic member are disposed at one and the other of the supporting members respectively, and the first coil corresponding to the first magnetic member and the second coil corresponding to the second magnetic member are disposed at one and the other of the supporting members respectively.

Also, an optical switching device using a galvanometer mirror according to the present invention is characterized in that the galvanometer mirror comprises at least a mirror; a moving body comprising a first coil and a second coil; supporting members for supporting the moving body tiltably around at least a first axis with respect to a stationary member; and magnetic circuits, wherein light from a first light conducting member is reflected at the galvanometer mirror, in which the first coil and the second coil are disposed at both sides of a plane passing through the center of gravity of the moving body and parallel to the surface of the mirror, and the light is selectively incident on a plurality of second light conducting members by controlling a tilt of the galvanometer mirror.

Furthermore, an optical switching device using a galvanometer mirror according to the present invention is characterized in that the galvanometer mirror comprises at least a mirror; a moving body comprising a first coil and a second coil; supporting members for supporting the moving body tiltably around at least a first axis with respect to a stationary member; and magnetic circuits, wherein light from a first light conducting member is reflected at the galvanometer mirror, in which the first coil and the second coil are disposed at one and the other of the supporting members for the moving body respectively, and the light is selectively incident on a plurality of second light conducting members by controlling a tilt of the galvanometer mirror.

Still furthermore, an optical switching device using a galvanometer mirror according to the present invention is characterized in that the galvanometer mirror comprises at least a mirror; a moving body comprising a first coil and a second coil; supporting members for supporting the moving body tiltably around at least a first axis with respect to a stationary member; and magnetic circuits, wherein light from a first light conducting member is reflected at the galvanometer mirror, in which a part of the magnetic circuit acting on the first coil and a part of the other magnetic circuit acting on the second coil are disposed at one and the other of the supporting members respectively, and the light is selectively incident on a plurality of second light conducting members by controlling a tilt of the galvanometer mirror.

Yet furthermore, an optical switching device using a galvanometer mirror according to the present invention is characterized in that the galvanometer mirror comprises at least a mirror; a moving body comprising a first magnetic member and a second magnetic member; supporting members for supporting the moving body tiltably around at least a first axis with respect to a stationary member; and coils, wherein light from a first light conducting member is reflected at the galvanometer mirror, in which the first magnetic member and the second magnetic member are disposed at one and the other of the supporting members respectively, and in which the first coil corresponding to the first magnetic member and the second coil corresponding to the second magnetic member are disposed at one and the other of the supporting members respectively, and wherein the light is selectively incident on a plurality of second light conducting members.

BRIEF DESCRIPTION OF THE DRAWINGS

FIGS. 16A and 16B are illustrations of a structure of a known example.

BEST MODE FOR CARRYING OUT THE INVENTION

Embodiments of the present invention will be described with reference to the accompanying drawings.

First Embodiment

Figure 1:
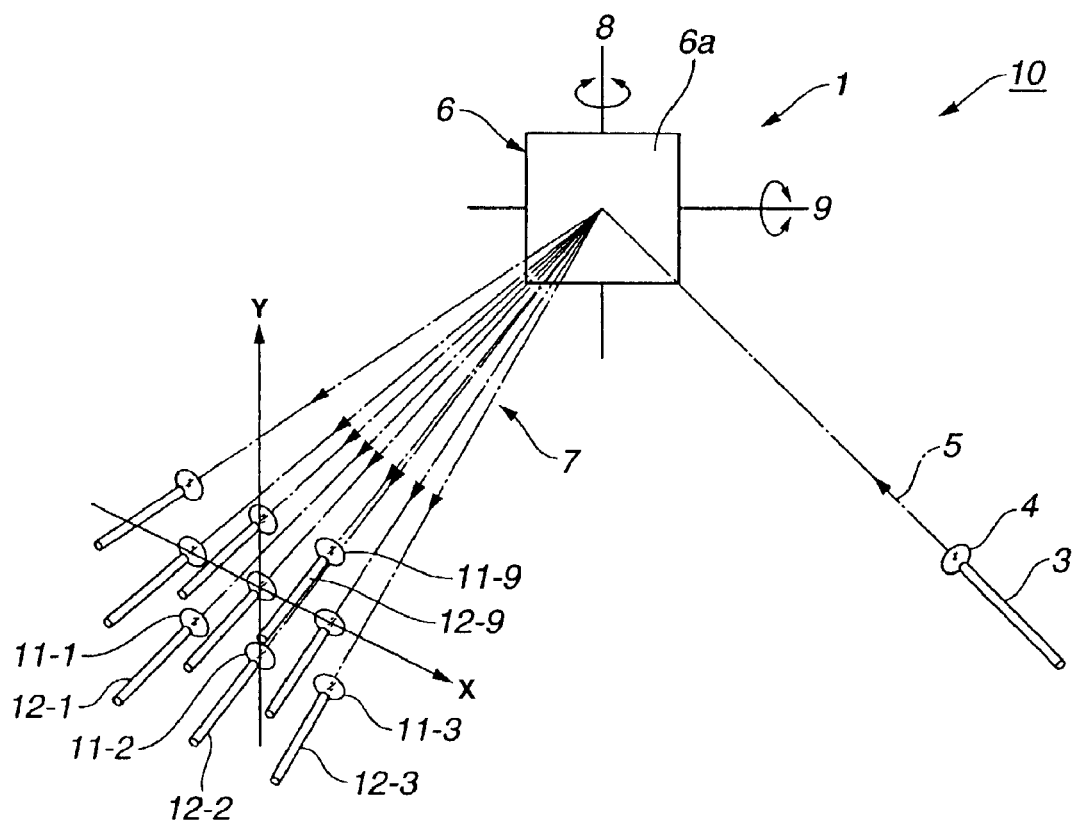
FIG. 1 is an illustration of a schematic configuration of an optical-path switching device according to a first embodiment of the present invention.
Figure 2:
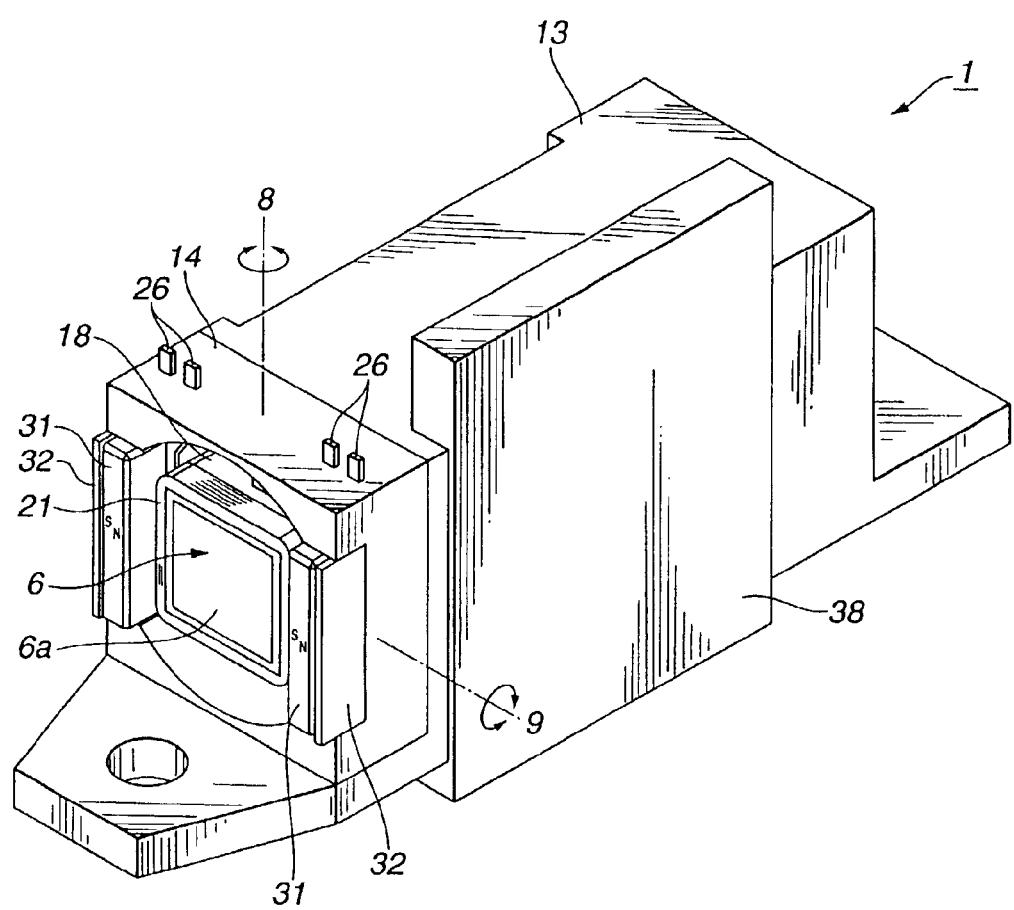
FIG. 2 is a perspective view illustrating a configuration of a galvanometer mirror according to the first embodiment of the present invention.
Figure 3:
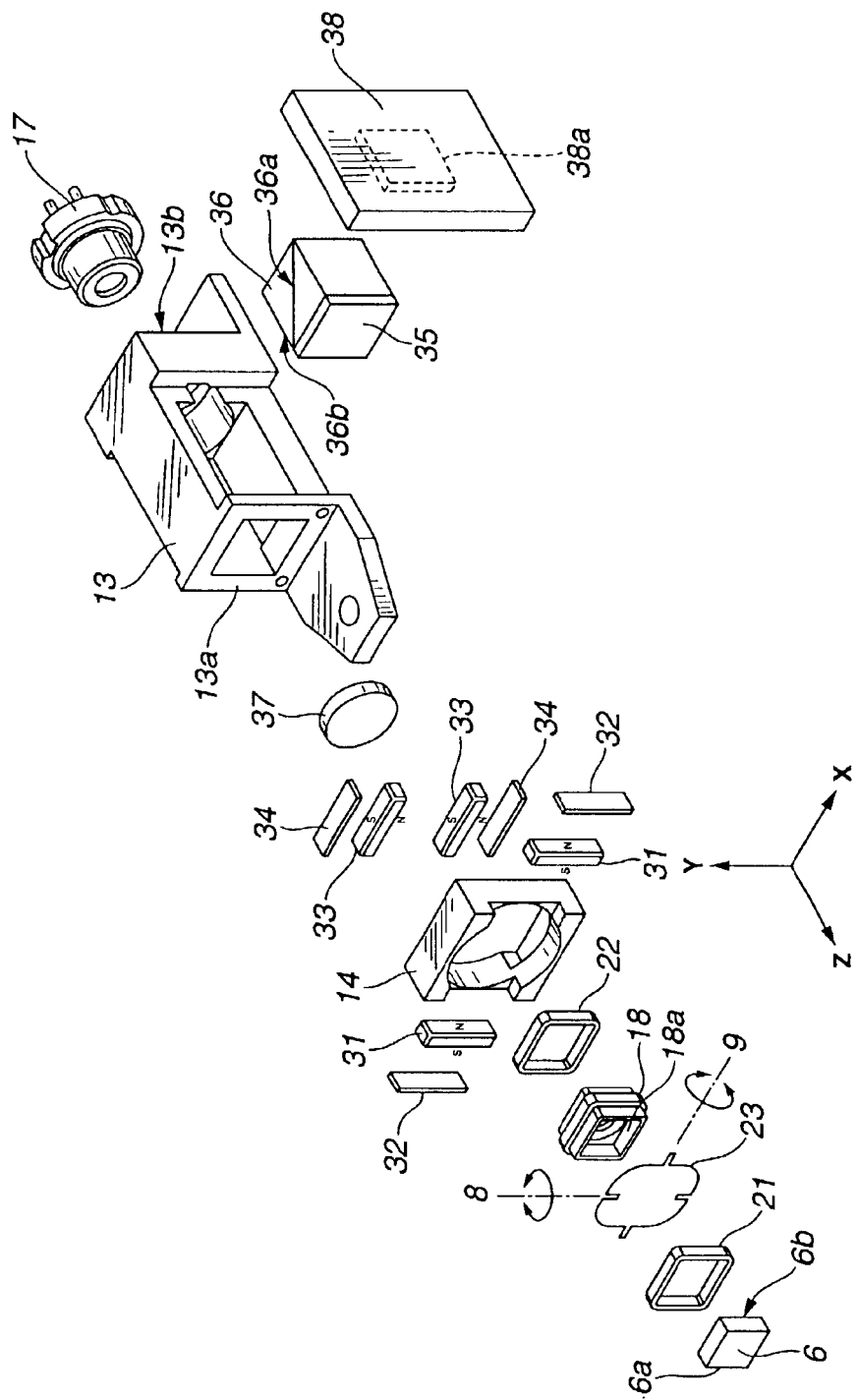
FIG. 3 is an exploded view illustrating the configuration of the galvanometer mirror.
Figure 4:
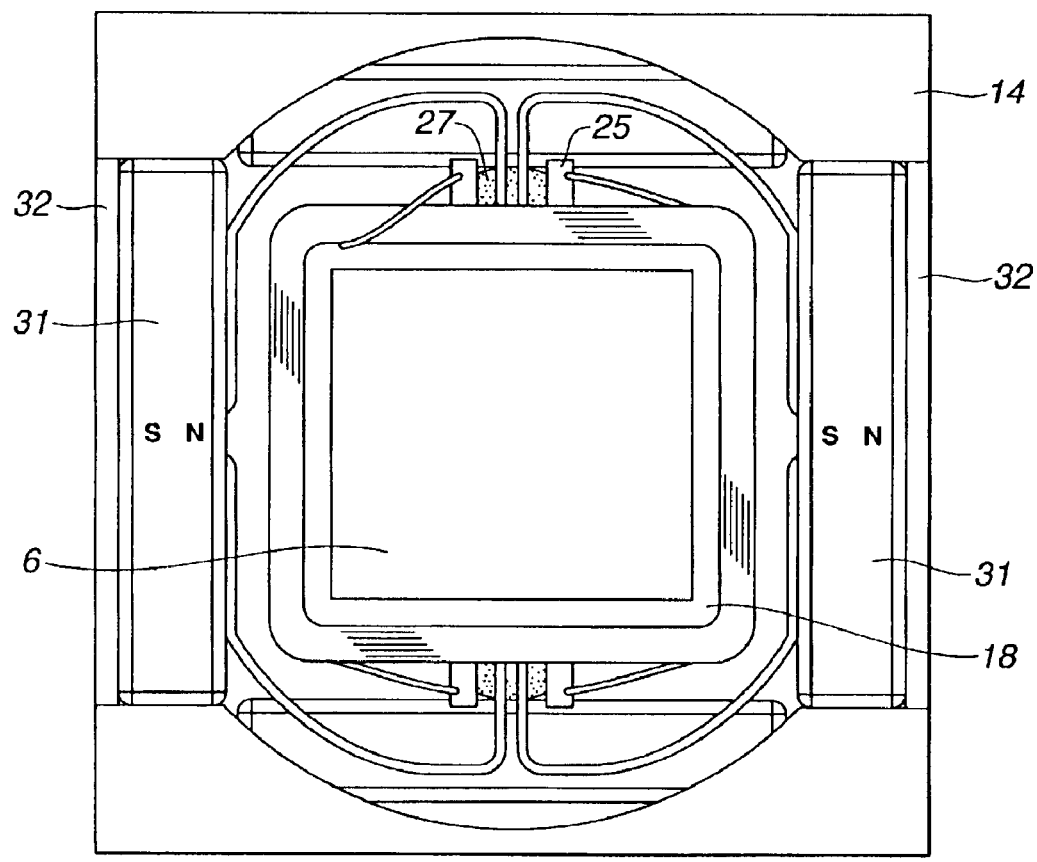
FIG. 4 is a front view of the galvanometer mirror.
Figure 5:
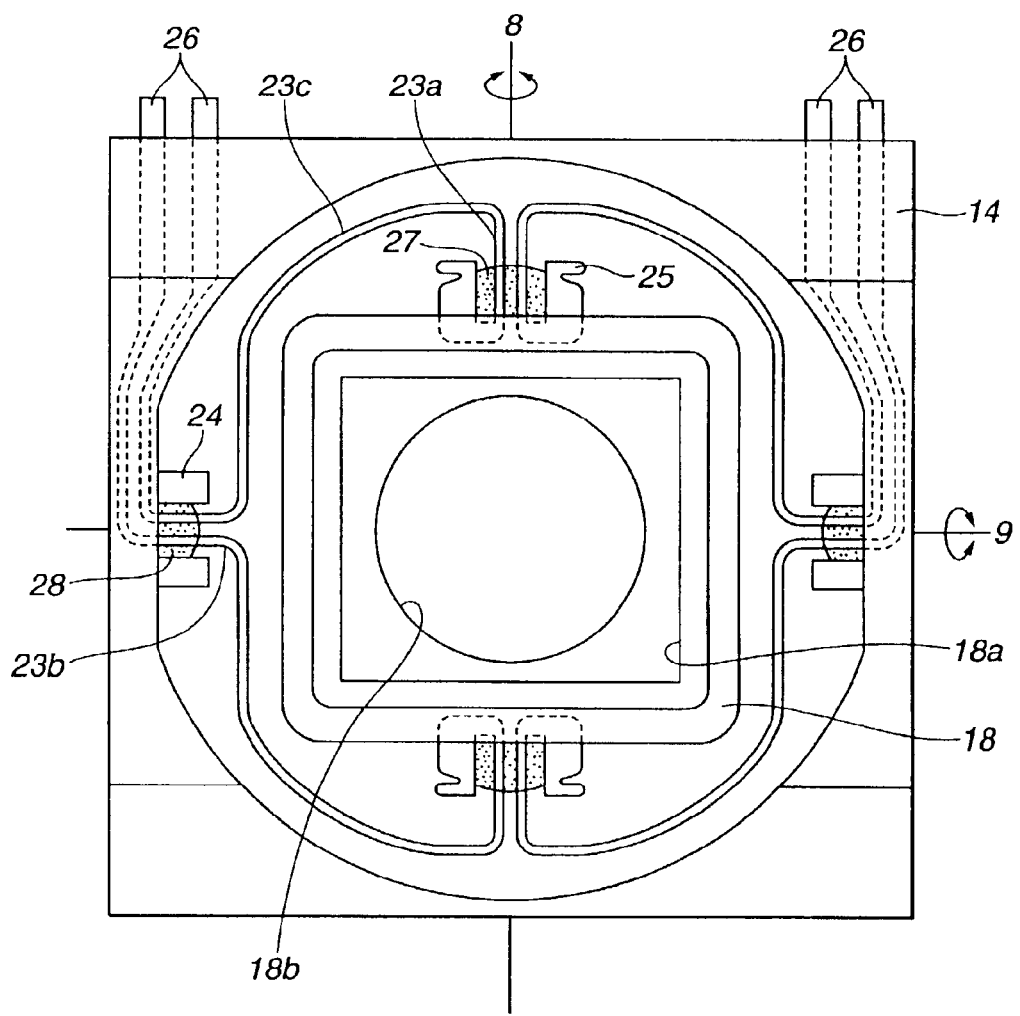
FIG. 5 is an illustration of the inside structure of the mirror shown in FIG. 4.
Figure 6:
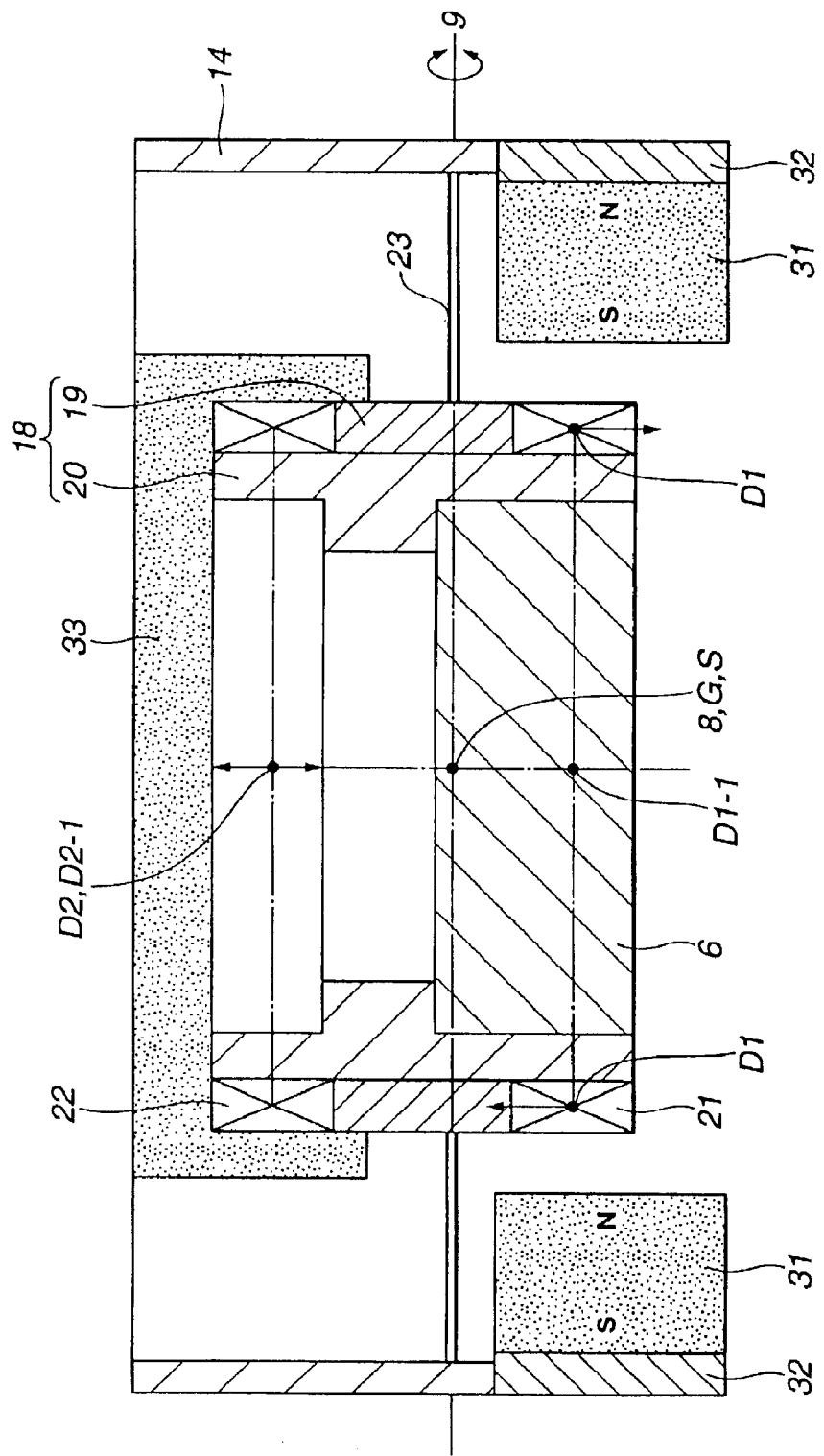
FIG. 6 is a sectional plan view illustrating the sectional structure viewed in the vertical direction.
Figure 7:
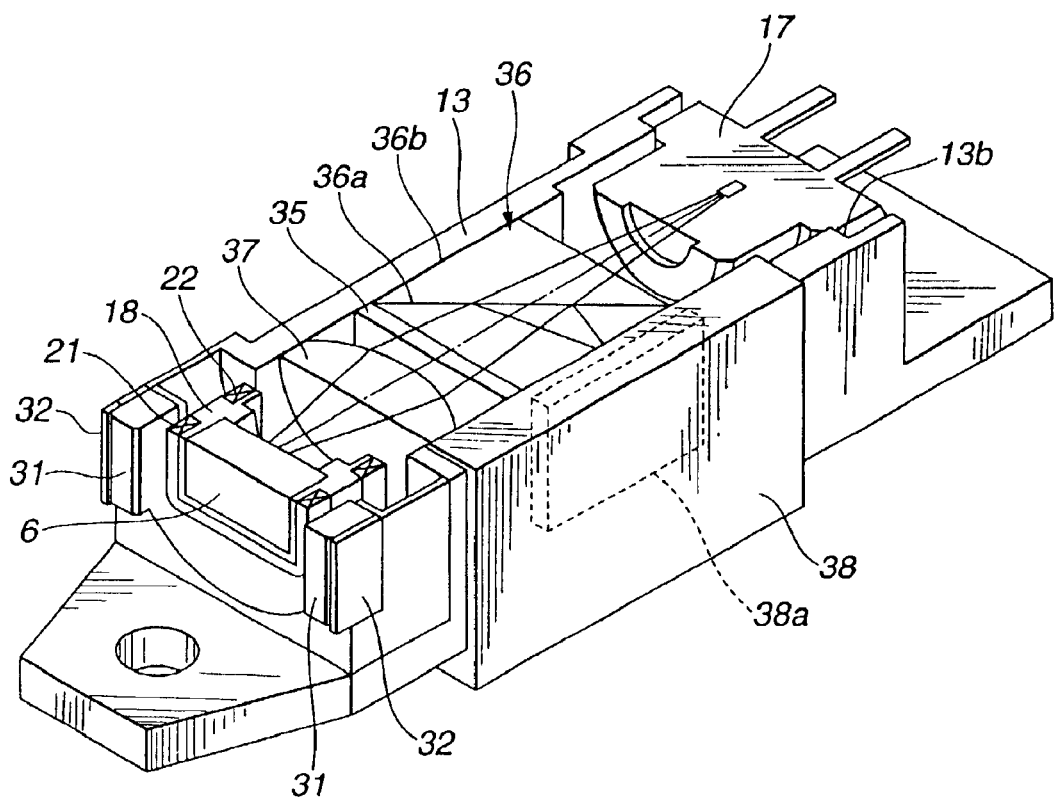
FIG. 7 is a perspective view illustrating the configuration of an optical system of an angle sensor cut along a horizontal plane.
Figure 8:
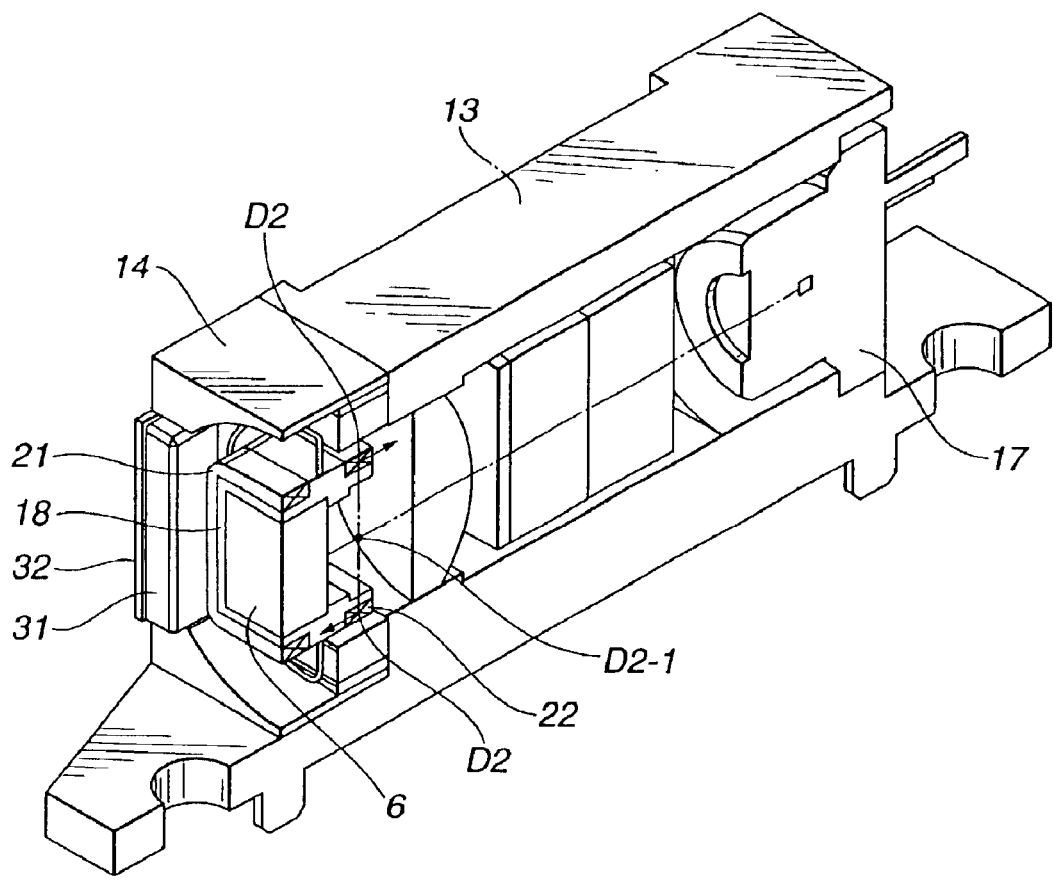
FIG. 8 is a perspective view illustrating the configuration of the optical system of the angle sensor cut along a vertical plane.

FIGS. 1 to 8 are concerned with a first embodiment of the present invention. FIG. 1 is an illustration of a schematic configuration of an optical-path switching device according to the first embodiment. FIG. 2 is a perspective view illustrating a configuration of a galvanometer mirror. FIG. 3 is an exploded view illustrating the configuration of the galvanometer mirror. FIG. 4 is a front view of the galvanometer mirror. FIG. 5 is an illustration of the inside structure of the mirror shown in FIG. 4. FIG. 6 illustrates the sectional structure viewed in the vertical direction. FIG. 7 illustrates the configuration of an optical system of an angle sensor cut along a horizontal plane. FIG. 8 illustrates the configuration of the optical system of the angle sensor cut along a vertical plane.

As shown in FIG. 1, a galvanometer mirror 1 according to the first embodiment is used for an optical-path switching device 10 for optical communication.

Signal transmission light for optical communication emitted from a single optical fiber 3 is transformed to parallel light by a lens 4, and incident light 5 is projected on a reflection surface 6a, which is the front face (surface) of a mirror 6 constituting the galvanometer mirror 1, and then is reflected at the reflection surface 6a to become reflected light 7.

The mirror 6 is rotatably supported around two rotation axes 8 and 9 which are orthogonal to each other. A tilting direction of the reflection surface 6a can be set without restraint by applying driving signals to two coils, discussed below, so that the mirror 6 rotates freely around the rotation axes 8 and 9.

The tilting direction of the reflection surface 6a of the mirror 6 is controlled by the driving signals so that the reflected light 7 at the reflection surface 6a of the mirror 6 is selectively incident on one of a total of nine lenses 11-1, 11-2, - - - , 11-9 arranged, for example, in three layers (lines) and three rows on a plane substantially orthogonal to the direction of the reflected light 7, and is selectively incident on one of nine optical fibers 12-i (i=1, 2, - - - , 9), each arranged on the optical axis of the corresponding lens 11-i.

For example, the reflected light 7 reflected at the mirror 6 is deflected in an X-direction, i.e., a right-and-left direction in FIG. 1, by tilting the mirror 6 around the rotation axis 8 and is deflected in a Y-direction, i.e., the up-and-down direction in FIG. 1, by tilting the mirror 6 around the rotation axis 9, so that the reflected light 7 is selectively incident on the nine lenses 11-1 to 11-9 and then is selectively incident on the optical fibers 12-1 to 12-9.

This configuration achieves optical-path switching by which an optical fiber is selected from among the nine optical fibers 12-i for outputting light emitted from the single optical fiber 3. The incident light 5 and the reflected light 7 are a major beam deflected at the mirror 6 of the galvanometer mirror 1. Referring now to FIGS. 2 to 8, the specific configuration of the galvanometer mirror 1 will be described.

As shown in FIG. 2, the galvanometer mirror 1 has a supporting and driving mechanism for rotatably supporting the mirror 6 disposed in the middle of a magnet holder 14 attached to an opening of the front of a housing 13, around the two axes 8 and 9 extending along the vertical direction and the horizontal direction, respectively, and a position detection device (utilizing light in two dimensions or in two directions) disposed in the housing 13 at the rear surface of the mirror 6 for detecting rotational displacement around the two axes of the mirror 6.

As shown in the drawings including FIG. 2, the mirror 6 has a square (or rectangular) plate-like shape and the reflection surface 6a at the front side thereof is coated with a film so as to improve the reflectivity of major light having a wavelength of, for example, 1.5 µm, which is used for optical communication. A rear surface 6b of the mirror 6 (see FIG. 3) is coated with a film so as to improve the reflectivity for sensor light having a wavelength of, for example, 780 nm, which is generated by a laser 17 (see FIG. 3).

The mirror 6 is housed and positioned in a fixing depression 18a in the middle of a square frame-like mirror holder 18, and the periphery thereof is firmly bonded.

As shown in FIG. 6, the mirror holder 18 has a first molded portion 19 formed in a square frame-like shape and a second molded portion 20 formed in a substantially frame-like shape inside the first molded portion 19, and the mirror 6 is firmly housed in the front surface of the second molded portion 20. The first molded portion 19 is formed in a step-like manner outside the second molded portion 20 and at the substantially central position with respect to the front-and-rear direction of the second molded portion 20. The step portion of the first molded portion 19 and the outer surfaces of the second molded portion 20 adjacent thereto serve as a coil holder for firmly holding a first coil 21 and a second coil 22.

Also, the first molded portion 19 has four springs 23 (see FIG. 5), having a substantially arc shape, disposed therearound. The one end of each spring 23 is insert-molded in the magnet holder 14 and the other end thereof is insert-molded in the mirror holder 18. Thus, the springs 23 are insert-molded in the magnet holder 14 and the mirror holder 18.

When the first molded portion 19 and the magnet holder 14 are molded from plastic, the inner part of the four springs 23 (formed from an etched beryllium copper 20-µm foil having a gold plate on the surface thereof) is firstly insert-molded into the first molded portion 19 of the mirror holder 18 and the outer part thereof is firstly insert-molded into the magnet holder 14, for allowing both ends of each spring 23 to be held.

Then, when the second molded portion 20 is formed, the first and second coils 21 and 22 are insert-molded at the front and back sides of the springs 23, respectively, and are thus fixed to the mirror holder 18. The mirror holder 18 to which the mirror 6 is attached and the first and second coils 21 and 22 that are attached around the outer surface of the mirror holder 18 constitute a moving body.

As shown in FIG. 5, the four springs 23 are fixed at one end thereof to four central spots close to the rotation axis 8, two on the upper surface and two on the lower surface of the mirror holder 18. Each spring 23 has a first deformed portion 23a, which is formed to be parallel to the rotation axis 8 in the vicinity of the fixed end thereof.

The four springs 23 are fixed at the other end thereof to four spots close to the rotation axis 9, two on the right sidewall and two on the left sidewall of the magnet holder 14. The spring 23 has a second deformed portion 23b, which is formed to be parallel to the rotation axis 9, in the vicinity of the other fixed end thereof. The second deformed portions 23b are designed to pass through rectangular projections 24, projecting from either one of the right and left sidewalls of the magnet holder 14.

Connecting portions 23c connecting the first and second deformed portions 23a and 23b are disposed so as to surround the four corners of the mirror holder 18. The four springs 23, each having the deformed portion 23a, the connecting portion 23c, and the deformed portion 23b, serve as supporting members in this embodiment.

In the vicinities of the first deformed portions 23a, soldering portions 25 connected to the first deformed portions 23a in the mirror holder 18 are disposed, and two end terminals of each of the first and second coils 21 and 22 are fixed to the total of four soldering portions 25 with a conductive adhesive.

The ends of the second deformed portion 23b are inserted into the magnet holder 14, extend through the magnet holder 14, and reach four terminals 26 that protrude from the outer surface of the magnet holder 14. When flexible cables are soldered to the four terminals 26 and electric power is fed through the flexible cables, the two coils 21 and 22 are supplied with driving signals through the four springs 23, thereby allowing the moving body to rotate.

Ultraviolet-curing silicone-gel dampers 27 and 28 are disposed by bonding at spots of the first deformed portions 23a and the corresponding soldering portions 25 and at spots of the second deformed portions 23b and the corresponding projections 24, respectively, and have a damping function against vibrations at both ends of the springs 23.

As shown in the drawings including FIGS. 3, 4, and 6, the two horizontally magnetized magnets 31 each have yokes 32 bonded to the backs thereof, and are firmly bonded to the right and left sides of the magnet holder 14 so as to inwardly face the first coil 21.

Thus, a magnetic circuit is configured such that the magnetic fields of the magnets 31 act on the first coil 21, which outwardly faces the magnets 31.

The mirror holder 18 and the magnet holder 14 are molded from a non-conductive plastic such as a liquid crystal polymer including titanium acid whiskers.

As shown in FIG. 3, two vertically magnetized magnets 33 each have yokes 34 bonded at the backs thereof, and are bonded to the upper and lower sides of the magnet holder 14 so as to inwardly face the second coil 22.

The substantially square frame-like magnet holder 14 is bonded on a fixing surface 13a of the front surface, which has an opening, of the housing 13, which is molded, for example, by zinc die-casting.

As described above, the mirror holder 18 having the mirror 6 fixed thereto and the first and second coils 21 and 22 constitute the moving body, and the center of gravity G of the moving body lies on the rotation axis 8 as well as on the rotation axis 9, as shown in FIG. 6. Also, the principal inertia axis of the moving body is coincident with the rotation axes 8 and 9.

The springs 23 are disposed so as to lie in the plane configured by the rotation axes 8 and 9. The first and second deformed portions 23a and 23b shown in FIG. 5 are placed so as to be substantially coincident with the rotation axes 8 and 9, respectively.

As shown in FIG. 6, the springs 23 are not disposed at the middle position between the first coil 21 and the second coil 22, which are respectively attached at the front and the rear, but are disposed at the position close to the first coil 21 where the mirror 6 is disposed, thereby allowing the center of gravity of the moving body including the mirror 6 to lie on the rotation axes 8 and 9 without using a balancer.

The first coil 21 have forces generated at driving points D1 thereon in the up-and-down direction parallel to the plane of FIG. 6, leading to generation of a torque acting around a middle point D1-1 lying at the middle point between the two driving points D1. FIG. 6 is a horizontally-cut sectional view including the rotation axis 9. The driving points D1 and the torque acting around the point D1-1 lie in the horizontal plane including the rotation axis 9.

The second coil 22 has forces generated on the sides thereof extending along the directions parallel to the plane of FIG. 6. The forces are generated at two driving points D2 indicated in FIG. 6 in the up-and-down direction in the vertical plane orthogonal to the plane of FIG. 6. As a result, torque acting around the middle point D2-1 is generated (the two points D2 overlap with the point D2-1 in the plane of FIG. 6). The driving points D2 and so forth are separately indicated in FIG. 8 for better understanding. FIG. 8 is a vertically cut perspective view of the galvanometer mirror 1 including the rotation axis 8, and the driving points D2 and the torque around the central point D2-1 lie in the vertical plane including the rotation axis 8.

As shown in FIG. 6, the galvanometer mirror 1 is formed such that the torques around the points D1-1 and D2-1 act close to the center of gravity G.

The housing 13 has an angle sensor attached thereon for detecting an angle of the mirror 6 rotating around the rotation axes 8 and 9.

As shown in FIGS. 3 and 7, a laser (diode) 17 as a light source for the sensor is pressed in and fixed to an opening 13b at the rear end of the housing 13. A PBS (polarizing beam splitter) 36, having a polarizing surface 36a on one side thereof to which a ¼λ plate 35 is bonded and a bonding surface 36b on another side thereof, is placed in front of laser beams emitted from the laser 17 and is firmly bonded to the corresponding inner wall of the housing 13.

Also, in front of the PBS 36, a lens 37 is placed in the housing 13 and is firmly bonded. Thus, laser beams emitted from the laser 17 are converged via the PBS 36, the ¼λ plate 35, and the lens 37, and are incident on the rear surface 6b of the mirror 6, which is held by the mirror holder 18. The mirror holder 18 is formed so as to provide a round opening 18b in the inner wall of the back thereof (see FIG. 5).

In addition, a position sensitive detector (PSD) 38 for detecting a two-directional irradiation light center position of projected light is firmly bonded to an opening provided in a sidewall of the housing 13 such that the sidewall opposes the side surface of the PBS 36 opposite to the bonding surface 36b as shown in FIG. 7. The PSD 38 is a two-dimensional position sensor that outputs the center position of light in the two directions (Y-direction and Z-directions) projected on a light receiving portion 38a thereof as a voltage; S5990-01, S7848-01, etc., made by Hamamatsu Photonics K.K can be used as the PSD 38.

The operation of the galvanometer mirror 1 having the above-described configuration will be described.

When electric current is applied to the first coil 21 via two of the four springs 23, the coil 21 generates torque around the rotation axis 8 by interacting with the magnetic fields generated by the magnets 31 disposed at the right and left sides of the coil 21, mainly causing the first deformed portions 23a to be twisted, and allowing the moving body to tilt (rotate) about the rotation axis 8.

When electric current is applied to the second coil 22 via the other two of the four springs 23, the coil 22 generates torque around the rotation axis 9 by interacting with the magnetic fields generated by the magnets 33 disposed at the upper and lower sides of the coil 22, mainly causing the second deformed portions 23b to be twisted, and allowing the moving body to tilt (rotate) about the rotation axis 9.

The laser light generated at the laser 17 is incident on the PBS 36 as P-polarized light, passes through the polarizing surface 36a at almost 100 percent, changes to circularly polarized light at the ¼λ plate 35, is incident on and condensed by the lens 37, and is incident on the rear surface 6b of the mirror 6. Since the light reflected at the rear surface 6b passes through the ¼λ plate 35, changes to S-polarized light which is deflected by 90 degrees at the polarizing surface, and is incident on a polarizing surface 36a as S-polarized light, almost 100 percent of the S polarized light is reflected at the polarizing surface 36a and is incident on the light receiving portion 38a of the PSD 38 in a spot shape.

When the mirror 6 tilts around the rotation axis 8, light on the light receiving portion 38a moves in the Z-direction shown in FIGS. 3 and 7, and when the mirror 6 tilts around the rotation axis 9, light on the light receiving portion 38a moves in the Y-direction, thereby allowing the PSD 38 to detect a two-dimensional angle of the mirror 6 with an output thereof.

Accordingly, by feeding driving signals to the first and second coils 21 and 22 such that the position detection signal of the PSD 38 has a desired value, (the reflection surface 6a of) the mirror 6 together with the moving body is controlled so as to have a desired tilt angle.

This embodiment has the following advantages.

In the galvanometer mirror in which the mirror 6, as an optical element, tilts around two axes, two kinds of the coils 21 and 22 integrally formed with the mirror 6 and tilting around the two axes are disposed so as to sandwich the springs 23 in the direction perpendicular to the reflection surface of the mirror 6, wherein the springs 23 are supporting members which encircle a two-dimensional center of rotation therein. With this arrangement, the center of driving torque generated by the coils 21 and 22 can be set to be not far away from the supporting members and the center of rotation.

Also, it is easy to allow the center of gravity of the moving body including the two kinds of coils 21 and 22 to lie on the center of rotation, thereby suppressing occurrence of resonance, which is one of the driving characteristics for tilting the mirror 6, and improving the servo characteristics.

Also, the coils 21 and 22 for tilting the mirror 6 in two directions are disposed at both sides of the supporting members and are separately placed in the direction perpendicular to the reflection surface 6a of the mirror 6. Thus, the two coils 21 and 22 and the magnets 31 and 33 serving as magnetic circuits for the respective coils are easily disposed so as to prevent interference with each other. Also, with this arrangement, displacement from a supporting point can be minimized even when the two coils 21 and 22 are placed separately in the direction perpendicular to the reflection surface 6a of the mirror 6, thereby allowing the magnets 31 and 33 for two-dimensional rotation to be easily disposed, to reduce mutual magnetic interference with each other, and to minimize disturbances in the magnetic fields acting on the two coils 21 and 22.

The four springs 23 also serve as a total of four power feeders (driving lines) for the coils 21 and 22 for two directional driving, two for +/− lines of each coil, thereby eliminating flexible cables and the like for supplying power to the moving body, and resulting in there being no effect on the supporting and driving operations of the mirror 6.

Furthermore, the dampers disposed at both ends of the springs 23 effectively reduce vibrations generated when the springs 23 are twisted.

Moreover, the angle sensor of the mirror 6 is disposed at the opposite side of the reflection surface 6a for main light beams, thereby allowing the angle sensor to avoid interference with the main light beams.

Incidentally, instead of the mirror 6, a prism, a lens, a combination of these optical elements, other optical elements, and the like may be used.

Also, instead of the PSD 38, a photodetector (PD) divided into four in the X-direction and Y-direction shown in FIG. 3 may be used. Alternatively, other angle sensors may be used.

The galvanometer mirror for optical communication has been described in this embodiment; however, it is also applicable to an optical deflector used for a measuring instrument, an optical storage pickup, and the like.

Second Embodiment

Figure 9:
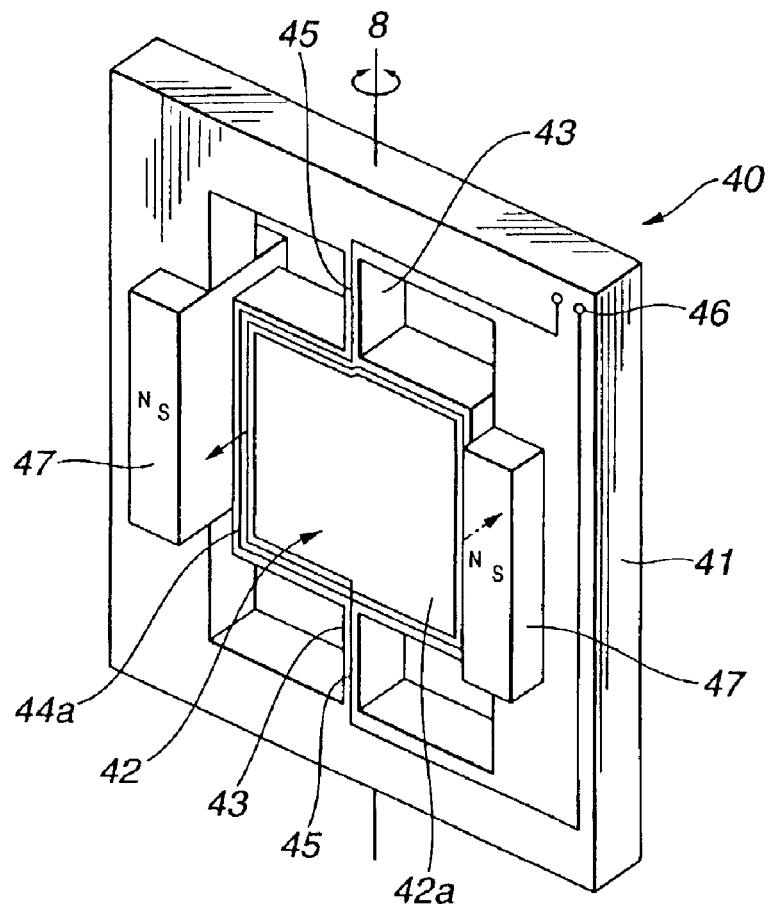
FIG. 9 is a perspective view illustrating a configuration of the major part of a galvanometer mirror according to a second embodiment of the present invention.
Figure 10:
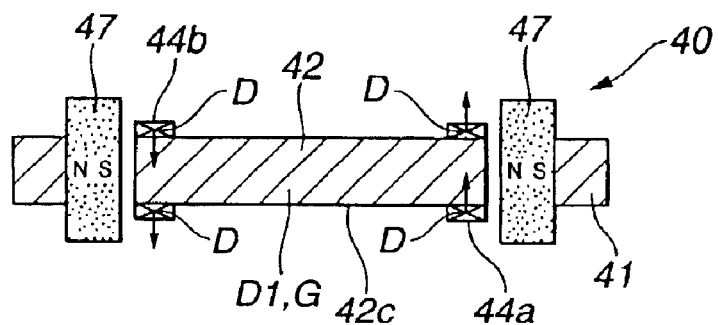
FIG. 10 is a sectional plan view illustrating a structure of the mirror shown in FIG. 9.

Referring now to FIGS. 9 and 10, a second embodiment of the present invention will be described. A galvanometer mirror 40 according to this embodiment rotates around a single axis.

The galvanometer mirror 40 shown in FIG. 9 has a frame 41 formed from a silicon substrate by etching in a semiconductor process, a rectangular mirror 42 lying in the middle of the frame 41, and springs 43 that thinly and linearly extend along up-and-down direction from the middle points with respect to the horizontal direction at the upper and lower sides of the mirror 42, respectively, and are connected to the frame 41.

Also, the mirror 42 has rectangular coils 44a and 44b (see FIG. 10) formed on both surfaces thereof by electroforming. Conductive patterns 45 formed on both surfaces of the two linear springs 43 (and the frame 41) allow terminals of the coils 44a and 44b to be connected to solder lands 46 provided on the frame 41. The two coils 44a and 44b are configured so as to sandwich the springs 43, the mirror 42, and the rotation axis 8 as a center axis of the springs 43.

The frame 41 has two magnets 47 positioned and firmly bonded in notches thereof so as to face the two coils 44a and 44b. The mirror 42 has a reflection surface 42a having improved reflection on the front surface thereof by, for example, providing a gold coating film thereon. The mirror 42 also has a coating film with gold or the like on the rear surface thereof for increasing reflection against sensor light.

A sensor such as the one described in the first embodiment is disposed at the backside of the mirror 42. In this case, one-dimensional sensor is usable (for example, a PSD that detects a position in X-direction shown in FIG. 3). Since the rest of the galvanometer mirror 40 has the same configuration with that described in the first embodiment, repetitive descriptions are omitted.

The two coils 44a and 44b on both surfaces have forces generated on driving points D thereof shown in FIG. 10. The center of torque caused by the above drive lies at D1.

As shown in FIG. 10, the galvanometer mirror 40 has a symmetric structure such that the rotation axis 8 and the center of torque D1 pass through the center of gravity G of a moving body having the mirror 42 and the coils 44a and 44b.

This embodiment has the following advantages.

The four power feeders for supplying power to the two coils 44a and 44b are formed on both surfaces of the two supporting springs 43 by utilizing both surfaces of the springs 43 for supporting the mirror 42, allowing each power feeder to be disposed on the corresponding spring surface, thereby making it easy to dispose the power feeders on the springs 43 having narrow width.

Also, the frame 41 and the moving body can be easily fabricated in a semiconductor process, thereby offering excellent manufacturabity.

Furthermore, the perfect symmetric shape with respect to the rotation axis 8 allows the galvanometer mirror 40 to be set in a perfectly (accurately) balanced condition, and also allows the center of torque to be precisely set so as to pass through the center of gravity G and to coincide with the rotation axis 8.

Third Embodiment

Figure 11:
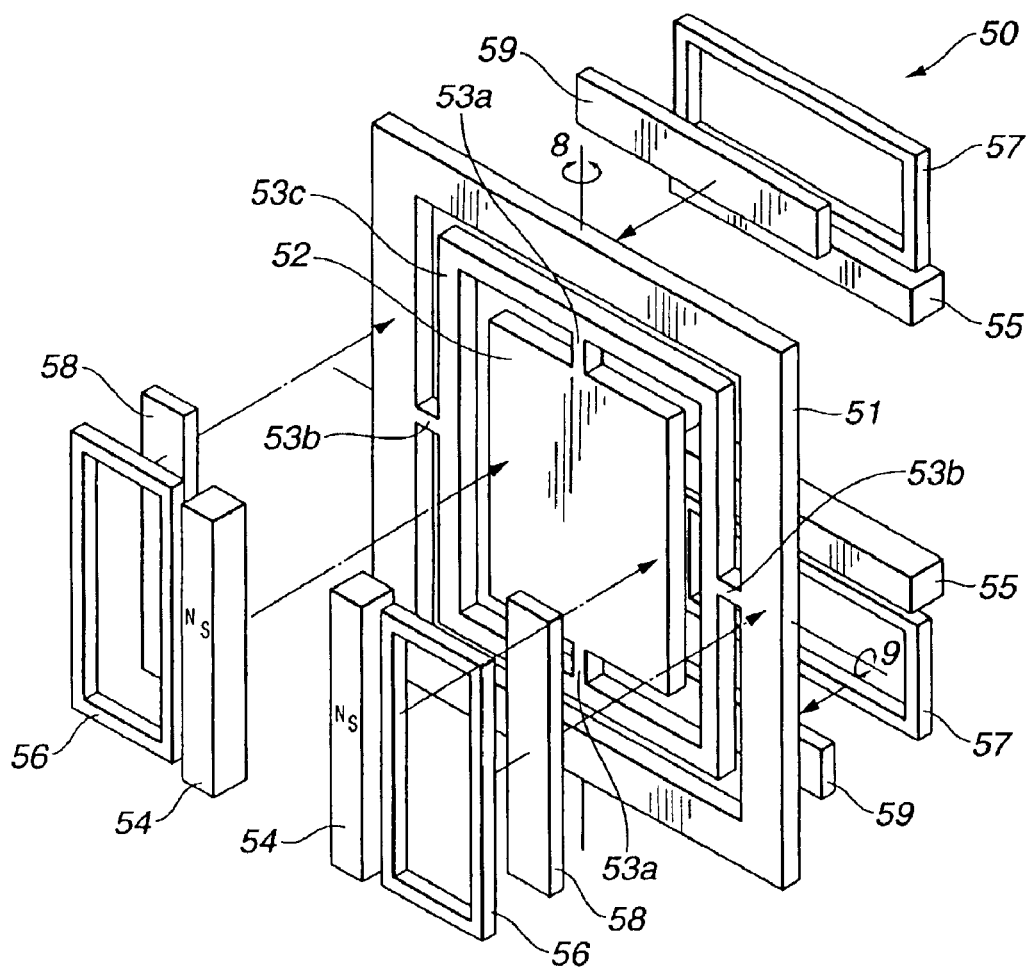
FIG. 11 is an exploded perspective view illustrating a configuration of the major part of a galvanometer mirror according to a third embodiment of the present invention.
Figure 12:
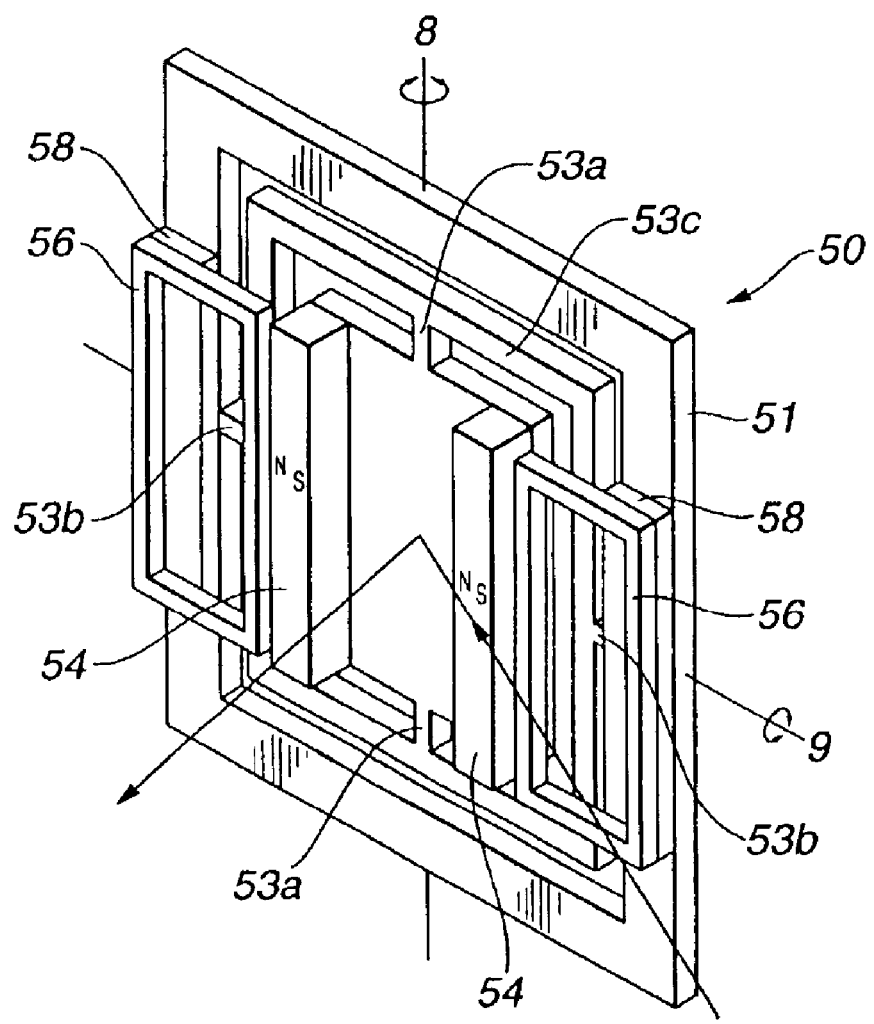
FIG. 12 is a perspective view illustrating a front structure of the mirror shown in FIG. 11.
Figure 13:
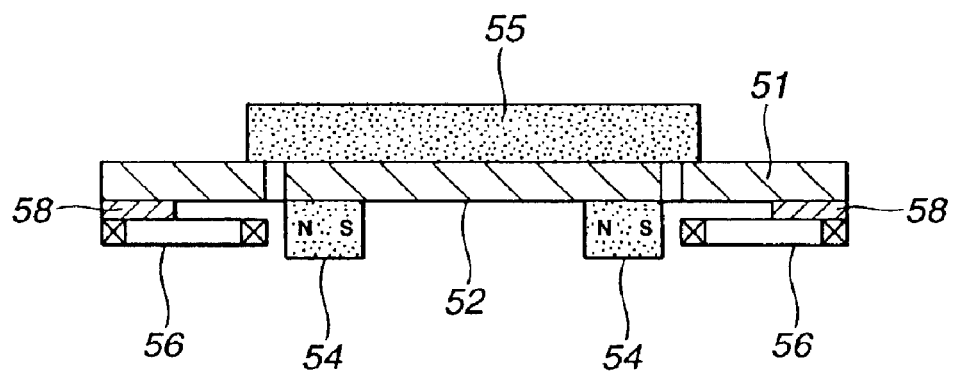
FIG. 13 is a sectional plan view of a configuration of the major part of the galvanometer mirror.
Figure 14:
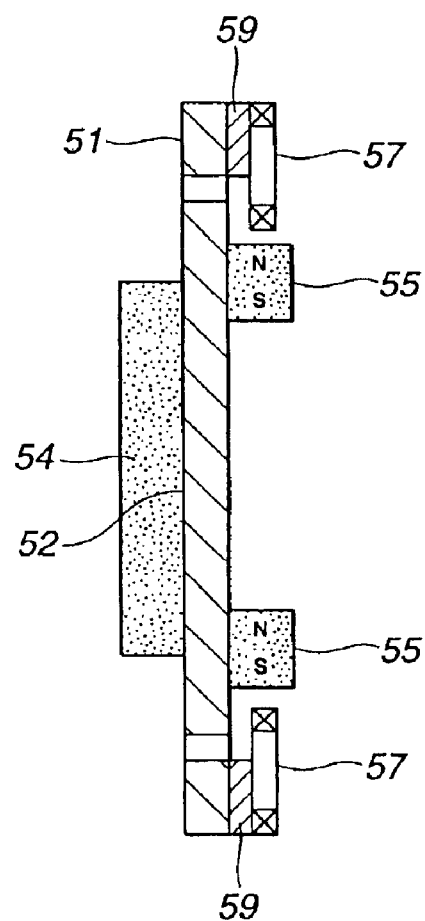
FIG. 14 is a sectional side view of the configuration of the major part of the galvanometer mirror.

Referring now to FIGS. 11 to 14, a third embodiment of the present invention will be described. FIG. 11 illustrates a configuration of an exploded major part of a galvanometer mirror according to the third embodiment. FIG. 12 illustrates a front structure of the major part. FIGS. 13 and 14 illustrate sectional structures of the major part in the horizontal and vertical planes of FIG. 12, respectively.

An exploded galvanometer mirror 50 (excluding a sensor) shown in FIG. 11 has a frame 51, a mirror 52, and springs 53 formed all at once by etching a silicon substrate having, for example, a thickness of 0.1 mm.

The square or rectangular plate-like mirror 52 formed in the middle of the frame 51 has a pair of first magnets 54 and a pair of second magnets 55 firmly fixed on both surfaces of the mirror 52, each pair in parallel in the vertical and horizontal directions, respectively.

Also, the frame 51 has a pair of first coils 56 and a pair of second coils 57 fixed on both surfaces thereof via the corresponding spacers 58 and 59, respectively. The springs 53 are connected to the mirror 52 lying in the middle, and have first deformed portions 53a extending in the vertical direction, second deformed portions 53b connected to the frame 51 and extending in the horizontal direction, and a square or rectangular frame-like connecting portion 53c for connecting the deformed portions 53a and 53b.

The first deformed portions 53a and the second deformed portions 53b rotatably support the mirror 52, which has the magnets 54 and 55 attached on both surfaces thereof, around the rotation axes 8 and 9, respectively.

As shown in FIG. 12, the incident light 5 is reflected at the front surface of the mirror 52, and then the reflected light 7 is introduced to the fiber 12-i (see FIG. 1).

Different from the first embodiment, the galvanometer mirror 50 in this embodiment has a configuration in which the magnets 54 and 55 are disposed on the moving body and the coils 56 and 57 are disposed on the stationary body, thereby eliminating wiring power feeders from the moving body to the stationary body. This configuration allows the four springs 53 to have a connected shape, and the first deformed portions 53a and the second deformed portions 53b to be disposed at the upper and lower sides and at the right and left sides of the mirror 52, respectively.

As shown in FIGS. 13 and 14, the first magnets 54 face the inner one of the right and left sides of the corresponding coils 56 and the second magnets 55 face the inner one of the upper and lower sides of the corresponding coils 57.

When electric current is applied to the first coils 56, forces are exerted on the first magnets 54, allowing the moving body to rotate around the axis 8. When electric current is applied to the second coils 57 are, forces are exerted on the second magnets 55, allowing the moving body to rotate around the axis 9.

The rest of the galvanometer mirror 50 has the same configuration with that in the first embodiment.

This embodiment has the following advantages.

The magnets 54 and 55 as two kinds of magnetic members for driving the mirror 52 to tilt in two directions are disposed respectively at the right and left sides and the upper and lower sides of the mirror 52, respectively, so as to sandwich the mirror 52 and the center of gravity of the moving body. Also, the springs 53a and 53b as parts of the supporting members are configured so as to be sandwiched by the two kinds of magnetic members. These configurations allow the center of gravity and the supporting point of the moving body to agree easily with each other, thereby minimizing the displacement between the driving points in two directions and the supporting point, accordingly suppressing occurrence of resonance at the time of driving the moving body and leading to the improved servo characteristics. In addition, the perfectly symmetric configuration with respect to the supporting point eliminates a balancer.

Disposing the magnets at the moving body for driving the moving body in two directions eliminates power supply to the moving body.

Moreover, since enough space can be kept between each pair of the coils 56 and 57 disposed on the stationary body, making it easy to dispose the two kinds of coils 56 and 57.

Fourth Embodiment

Figure 15:
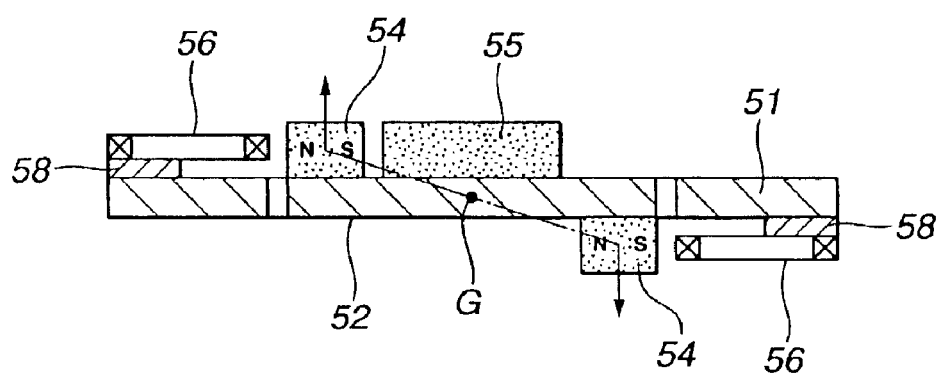
FIG. 15 is a sectional plan view illustrating the major part of a galvanometer mirror according to a fourth embodiment of the present invention.

Referring now to FIG. 15, a fourth embodiment of the present invention will be described. A configuration in this embodiment is a partial modification of the configuration in the third embodiment.

Referring also to FIG. 11, more specifically, a galvanometer mirror according to this embodiment has a configuration such that one of the pair of magnets 54 attached on the right and left sides of the front surface of the mirror 52 is attached on the rear surface of the mirror 52 so as to be symmetrical with respect to the axis of the first deformed portions 53a of the springs. Associated with the above configuration, one of the pair of first coils 56 is firmly fixed to the rear surface of the frame 51 via the corresponding spacer 58.

Likewise, one of the pair of magnets 55 attached on the upper and lower sides of the rear surface of the mirror 52 in FIG. 11 is attached on the front surface of the mirror 52 so as to be symmetrical with respect to the axis of the second deformed portions 53b. Associated with this configuration, one of the pair of second coils 57 is firmly fixed to the front surface of the frame 51 via the corresponding spacer 59.

FIG. 15 is a sectional plan view of the major part of the galvanometer mirror with the above-described configuration.

According to the configuration of this embodiment, when electric current is applied to the first coils 56, driving points of the two magnets 54 on which forces are exerted magnetically by the coils 56 can be aligned on a line passing through the center of gravity G and at an equal distance away from the center of gravity G (and also, the center of torque by the two driving points can be positioned at the center of gravity G).

Likewise, when electric current is applied to the second coils 57, driving points of the two magnets 55 on which forces are exerted magnetically by the coils 57 can be aligned on a line passing through the center of gravity G and at an equal distance away from the center of gravity G (and also, the center of torque by the two driving points can be positioned at the center of gravity G).

According to this embodiment, a galvanometer mirror having excellent driving characteristics can be achieved.

Incidentally, for example, FIG. 15, a pair of coils may be disposed in stead of the moving magnets 54 and a pair of magnets may be disposed instead of the stationary coils 56.

Note that the present invention is not limited to the configurations of the above-described embodiments. Also, a silicon mirror, a plastic molded piece, a prism, and the like are available as the above-described mirror.

Although the embodiments of the present invention have been described above, the present invention is not limited to the above embodiments, but can be modified in various ways without departing from the sprit of the present invention.

INDUSTRIAL APPLICABILITY

As described above, according to the present invention, in a galvanometer mirror comprising at least: a mirror, a moving body comprising a first and second coils, supporting members for supporting the moving body tiltably around at least a first axis with respect to a stationary member, and magnetic circuits, the first and second coils are disposed so as to sandwich the center of gravity of the moving body or the supporting members, allowing the center of torque exerted on the moving body via the first and second coils to be set in the vicinity of the center of gravity or the supporting point of the supporting members.

What is claimed is:

1. A galvanometer mirror comprising at least:

a mirror;

a moving body comprising a first coil and a second coil;

supporting members for supporting the moving body tiltably around at least a first axis with respect to a stationary member; and magnetic circuits, wherein the first coil and the second coil are disposed at both sides of a plane which passes through a center of gravity of the moving body and which is parallel to a surface of said mirror.

2. A galvanometer mirror comprising at least:

a mirror;

a moving body comprising a first coil and a second coil;

supporting members for supporting the moving body tiltably around at least a first axis with respect to a stationary member; and magnetic circuits, wherein the first coil and the second coil are respectively disposed at a front side and a back side of the supporting members.

3. A galvanometer mirror comprising at least:

a mirror;

a moving body comprising a first coil and a second coil;

supporting members for supporting the moving body tiltably around at least a first axis with respect to a stationary member; and magnetic circuits, wherein at least a part of a first magnetic circuit acting on the first coil and at least a part of a second magnetic circuit acting on the second coil are respectively disposed at a front side and a back side of the supporting members.

4. A galvanometer mirror comprising at least:

a mirror;

a moving body comprising a first magnetic member and a second magnetic member;

supporting members for supporting the moving body tiltably around at least a first axis with respect to a stationary member; and coils, wherein the first magnetic member and the second magnetic member are respectively disposed at a front side and a back side of the supporting members, and a first coil corresponding to the first magnetic member and a second coil corresponding to the second magnetic member are respectively disposed at the front side and the back side of the supporting members.

5. The galvanometer mirror according to claim 1, wherein the moving body is tiltably supported around the first axis and a second axis.

6. An optical switching device having a galvanometer mirror comprising at least:

a mirror;

a moving body comprising a first coil and a second coil;

supporting members for supporting the moving body tiltably around at least a first axis with respect to a stationary member; and magnetic circuits, wherein the first coil and the second coil are disposed at both sides of a plane which passes through a center of gravity of the moving body and which is parallel to a surface of said mirror, and wherein light from a first light conducting member is reflected at the galvanometer mirror so as to be selectively incident on a plurality of second light conducting members by controlling a tilt of the galvanometer mirror.

7. The galvanometer mirror according to claim 2, wherein the moving body is tiltably supported around the first axis and a second axis.

8. The galvanometer mirror according to claim 3, wherein the moving body is tiltably supported around the first axis arid a second axis.

9. The galvanometer mirror according to claim 4, wherein the moving body is tiltably supported around the first axis and a second axis.

10. A galvanometer mirror comprising at least;

a mirror;

a moving body comprising a first coil and a second coil;

supporting members for supporting the moving body tiltably around at least a first axis with respect to a stationary member; and magnetic circuits including magnetic members, wherein the first coil and the second coil are at least one of: (i) respectively disposed at a front side and a back side of the supporting members, (ii) disposed at both sides of a plane which passes through center of gravity of the moving body and which is parallel to a surface of the mirror, and (iii) disposed at both sides of a plane which passes through a rotation axis of the moving body and which is parallel, to the surface of the mirror, and wherein a tilt of the mirror is controlled by applying drive signals to at least one of the first coil and the second coil.

11. The galvanometer mirror according to claim 10, wherein light reflected by the mirror is incident on a second light conducting member by controlling the tilt of the mirror at which light from a first light conducting member is reflected.

12. The galvanometer mirror according to claim 10, further comprising a tilt sensor for detecting the tilt of the mirror.

13. The galvanometer mirror according to claim 11, wherein a plurality of optical paths from the first light conducting member to the second light conducting member are switched by controlling the tilt of the mirror.

14. A galvanometer mirror comprising at least:

a mirror;

a moving body comprising a first magnetic member and a second magnetic member;

supporting members for supporting the moving body tiltably around a first axis arid a second axis with respect to a stationary member such that the first magnetic member is adapted to tilt the moving member around the first axis and the second magnetic member is adapted to tilt the moving member around the second axis; and coils, wherein the first magnetic member and the second magnetic member are at least one of: (i) respectively disposed at a front side and a back side of the supporting members, (ii) respectively disposed at a front side and a back side of a plane which passes through a center of gravity of the moving body and which is parallel to a surface of the mirror, and (iii) respectively disposed at a front side and a back side of a plane which passes through a rotation axis of the moving body and which is parallel to the surface of the mirror, and wherein a tilt of the mirror is controlled by applying drive signals to the coils.

15. The galvanometer mirror according to claim 14, wherein light reflected by the mirror is incident on a second light conducting member by controlling the tilt of the mirror at which light from a first light conducting member is reflected.

16. The galvanometer mirror according to claim 14, further comprising a tilt sensor for detecting the tilt of the mirror.

17. The galvanometer mirror cording to claim 15, wherein a plurality of optical paths from the first light conducting member to the second light conducting member are switched by controlling the tilt of the mirror.

18. A galvanometer mirror comprising at least:

a mirror;

a moving body comprising coils;

supporting members for supporting the moving body tiltably around at least a first axis with respect to a stationary member; and magnetic circuits respectively including a first magnetic member and a second magnetic member, wherein the first magnetic member and the second magnetic member are at least one of: (i) respectively disposed at a front side and a back side of the supporting members, (ii) respectively disposed at a front side and a back side of a plane which passes through a center of gravity of the moving body and which is parallel to a surface of the mirror, and (iii) respectively disposed at a front side and a back side of a plane which passes through a rotation axis of the moving body and which is parallel to the surface of the mirror, and wherein a tilt of the mirror is controlled by applying drive signals to the coils.

19. The galvanometer mirror according to claim 18, wherein light reflected by the mirror is incident on a second light conducting member by controlling the tilt of the mirror at which light from a first light conducting member is reflected.

20. The galvanometer mirror according to claim 18, further comprising a tilt sensor for detecting the tilt of the mirror.

21. The galvanometer mirror according to claim 19, wherein a plurality of optical paths from the first light conducting member to the second light conducting member are switched by controlling the tilt of the mirror.

22. A galvanometer mirror comprising at least:

a mirror;

a moving body comprising magnetic members;

supporting members for supporting the moving body tiltably around at least a first axis with respect to a stationary member, and a first coil and a second coil, wherein the first coil and the second coil are at least one of (i) respectively disposed at a front side and a back side of the supporting members, (ii) disposed at both sides of a plane which passes through a center of gravity of the moving body and which is parallel to a surface of the mirror, and (iii) disposed at both sides of a plane which passes through a rotation axis of the moving body arid which is parallel to the surface of the mirror, and wherein a tilt of the mirror is controlled by applying drive signals to at least one of the first coil and the second coil.

23. The galvanometer mirror according to claim 22, wherein light reflected by the mirror is incident on a second light conducting member by controlling the tilt of the mirror at which light from a first light conducting member is reflected.

24. The galvanometer mirror according to claim 22, further comprising a tilt sensor for detecting the tilt of the mirror.

25. The galvanometer mirror according to claim 23, wherein a plurality of optical paths from the first light conducting member to the second light conducting member are switched by controlling the tilt of the mirror.

* * * * *